United States Patent
Elian et al.

(10) Patent No.: US 8,513,771 B2
(45) Date of Patent: Aug. 20, 2013

(54) SEMICONDUCTOR PACKAGE WITH INTEGRATED INDUCTOR

(75) Inventors: Klaus Elian, Alteglofsheim (DE); Horst Theuss, Wenzenbach (DE); Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 12/795,230

(22) Filed: Jun. 7, 2010

(65) Prior Publication Data

US 2011/0298088 A1   Dec. 8, 2011

(51) Int. Cl.
*H01L 29/86* (2006.01)
*H01L 21/56* (2006.01)

(52) U.S. Cl.
USPC ............ 257/531; 257/E29.325; 257/E21.502; 438/3

(58) Field of Classification Search
USPC ............................ 257/531, E29.325, E21.502
See application file for complete search history.

(56) References Cited

U.S. PATENT DOCUMENTS

| | | | |
|---|---|---|---|
| 2,465,276 A | 3/1949 | Ryder | |
| 5,349,743 A | 9/1994 | Grader et al. | |
| 5,539,241 A | 7/1996 | Abidi et al. | |
| 5,547,599 A | 8/1996 | Wolfrey et al. | |
| 5,781,091 A | 7/1998 | Krone et al. | |
| 5,821,846 A | 10/1998 | Leigh et al. | |
| 5,959,846 A | 9/1999 | Noguchi et al. | |
| 6,114,937 A | 9/2000 | Burghartz et al. | |
| 6,191,468 B1 | 2/2001 | Forbes et al. | |
| 6,287,931 B1 | 9/2001 | Chen | |
| 6,338,900 B1 | 1/2002 | Tada et al. | |
| 6,417,039 B2 | 7/2002 | Webster | |
| 6,480,086 B1 | 11/2002 | Kluge et al. | |
| 6,643,913 B2 | 11/2003 | Uchikoba et al. | |
| 6,817,085 B2 | 11/2004 | Uchikoba et al. | |
| 6,927,662 B2 | 8/2005 | Kahlmann et al. | |
| 7,061,359 B2 | 6/2006 | Ding et al. | |
| 7,187,263 B2 * | 3/2007 | Vinciarelli | 336/200 |
| 7,208,345 B2 | 4/2007 | Meyer et al. | |
| 7,209,026 B2 | 4/2007 | Frutschy et al. | |
| 7,233,224 B2 | 6/2007 | Strzalkowski et al. | |
| 7,262,680 B2 | 8/2007 | Wang | |
| 7,271,693 B2 | 9/2007 | Ding et al. | |
| 7,375,609 B2 | 5/2008 | Suzuki et al. | |

(Continued)

FOREIGN PATENT DOCUMENTS

| | | |
|---|---|---|
| DE | 10232642 A1 | 2/2004 |
| DE | 102008047395 A1 | 7/2009 |
| DE | 102011002578 A1 | 7/2011 |

OTHER PUBLICATIONS

Yamaguchi, K., et al. "Characteristics of a Thin Film Microtransformer with Circular Spiral Coils," IEE, Transactions on Magnetics, vol. 29, No. 5, Sep. 1993, pp. 2232-2237.

(Continued)

*Primary Examiner* — Victor A Mandala
*Assistant Examiner* — Whitney T Moore
(74) *Attorney, Agent, or Firm* — Slater & Matsil, L.L.P.

(57) ABSTRACT

A semiconductor package includes a semiconductor chip. An inductor is applied to the semiconductor chip. The inductor has at least one winding. An encapsulation body is formed of an encapsulation material. The encapsulation material contains a magnetic component and fills a space within the winding to form a magnetic winding core.

23 Claims, 7 Drawing Sheets

(56) References Cited

U.S. PATENT DOCUMENTS

| | | |
|---|---|---|
| 7,463,131 B1 | 12/2008 | Hwang et al. |
| 7,489,226 B1 | 2/2009 | Chignola et al. |
| 7,518,480 B1 | 4/2009 | Dening et al. |
| 7,579,197 B1 | 8/2009 | Li |
| 7,781,231 B2 | 8/2010 | Li |
| 7,852,185 B2 | 12/2010 | Gardner et al. |
| 7,885,105 B2 | 2/2011 | Li et al. |
| 7,915,991 B2 | 3/2011 | Waffenschmidt et al. |
| 2002/0050626 A1 | 5/2002 | Onuma et al. |
| 2006/0249754 A1* | 11/2006 | Forman et al. ............... 257/208 |
| 2007/0069333 A1* | 3/2007 | Crawford et al. ............ 257/531 |
| 2007/0236393 A1 | 10/2007 | Anzai |
| 2008/0054398 A1 | 3/2008 | Lin et al. |
| 2009/0140383 A1 | 6/2009 | Chang et al. |
| 2009/0243780 A1* | 10/2009 | Inoue et al. .................. 336/200 |
| 2009/0280646 A1 | 11/2009 | Iwaya et al. |
| 2010/0109123 A1* | 5/2010 | Strzalkowski et al. ....... 257/531 |
| 2010/0127345 A1 | 5/2010 | Sanders et al. |
| 2011/0084765 A1* | 4/2011 | Kim et al. .................... 330/277 |
| 2011/0169596 A1* | 7/2011 | Ahrens et al. ................ 336/200 |

OTHER PUBLICATIONS

Jones, G., "Miniature solutions for voltage isolation," Analog Applications Journal, Texas Instruments Incorporated, ww.ti.com/aaj, 2005, pp. 13-18.

* cited by examiner

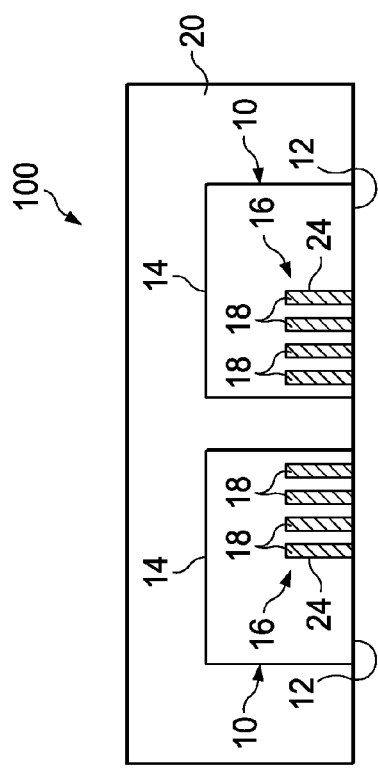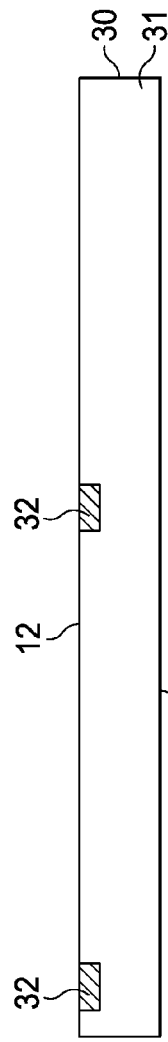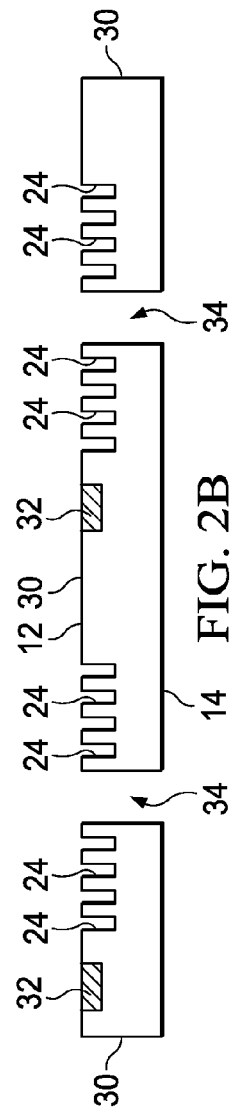

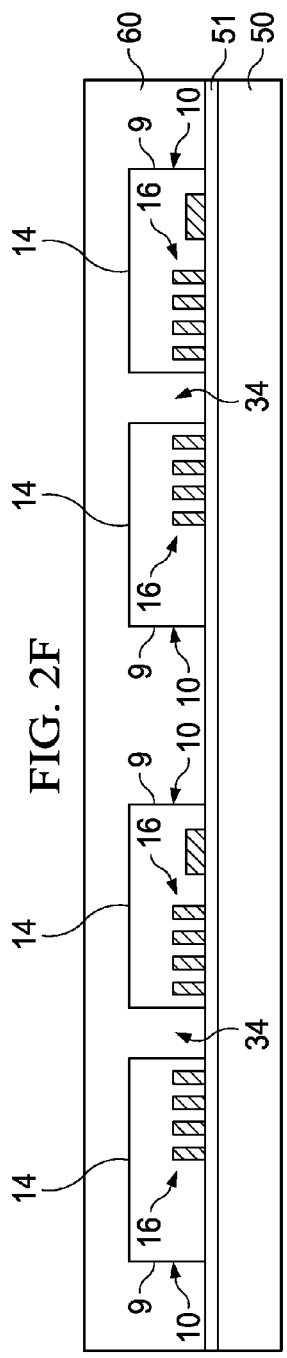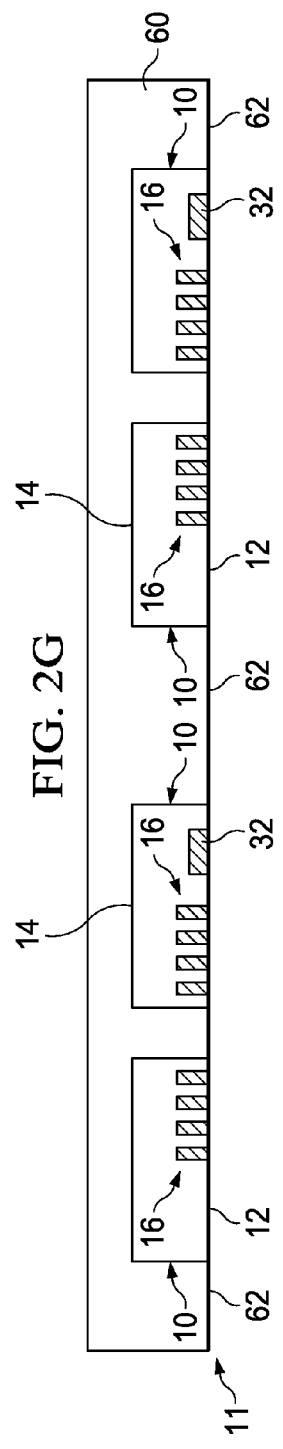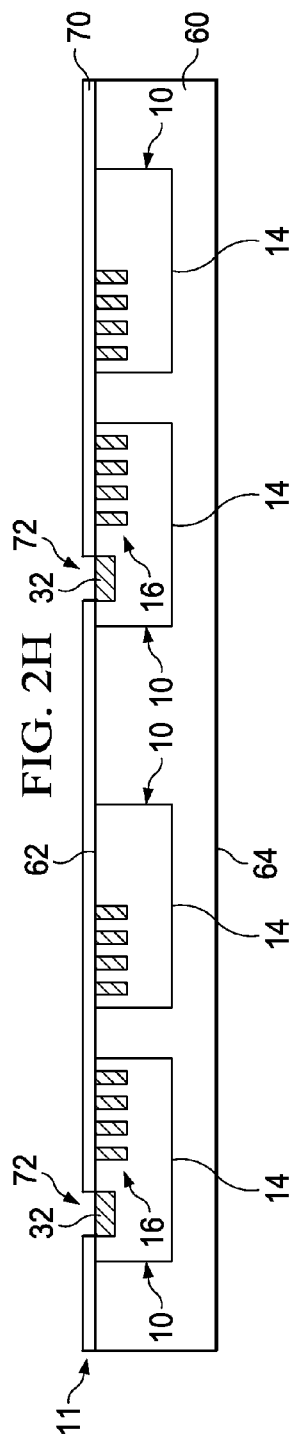

SEMICONDUCTOR PACKAGE WITH INTEGRATED INDUCTOR

TECHNICAL FIELD

The invention relates generally to semiconductor packages, and more particularly to packaging of a semiconductor chip and an inductor.

BACKGROUND

Semiconductor chips are encapsulated in a mold compound in order to protect the chips from environmental impacts to ensure reliability and performance. In many applications such as, e.g., RF (radio frequency) devices, inductors are coupled to the chips and embedded in the packages. Such packages may become large, sophisticated and expensive. However, both the manufacturers and the consumers of electronic devices desire devices that are inexpensive, reduced in size and yet have increased device functionality.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIG. 1 is a cross-sectional view of an exemplary embodiment of a package comprising a semiconductor chip, an inductor and an encapsulation body.

FIGS. 2A to 2K schematically illustrate one exemplary embodiment of a method to produce a semiconductor package.

DETAILED DESCRIPTION OF ILLUSTRATIVE EMBODIMENTS

Figure 2C:
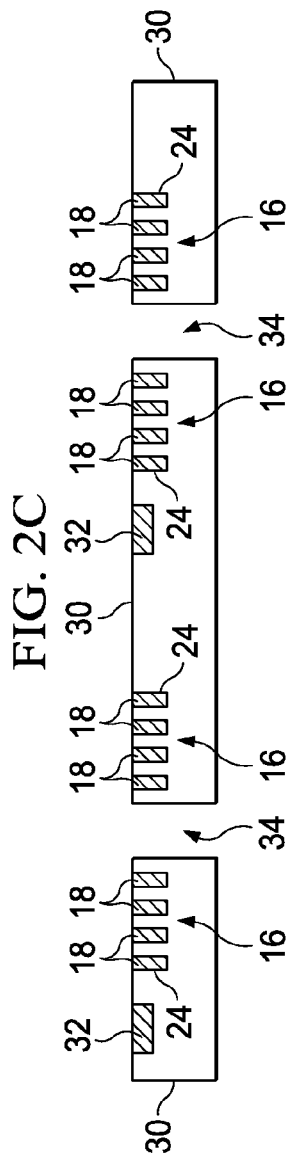

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets, cavities or substrates in the figures are not necessarily drawn to scale.

In the following detailed description, reference is made to the accompanying drawings, which form a part thereof, and in which is shown by way of illustration specific embodiments in which the invention may be practiced. In this regard, directional terminology, such as, e.g., "upper", "lower", "top", "bottom", "left-hand", "right-hand", "front side", "backside", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include, for example, integrated electrical circuits, electro-optical circuits, electro-mechanical circuits such as, e.g., MEMS (Micro-Electro-Mechanical System) and/or passives. The semiconductor chips described herein may include RF (radio frequency) circuits, control circuits, logic circuits or microprocessors. The semiconductor chips need not be manufactured from specific semiconductor material, for example, Si, SiC, SiGe, GaAs, and, furthermore, may contain inorganic and/or organic materials that are not semiconductors, such as, for example, discrete passives, antennas, insulators, plastics or metals.

According to one aspect, an encapsulation material is provided. The encapsulation material may at least partially cover the semiconductor chip to form an encapsulation body. The encapsulation material may be based on a polymer material, i.e., may comprise a basis material (also referred to as matrix material in the following) made of any appropriate duroplastic, thermoplastic or thermosetting material or laminate (prepreg). In particular, a matrix material based on epoxy resin may be used. The matrix material may contain a filler material, e.g., $SiO_2$ particles, to adjust physical properties of the encapsulation body such as, e.g., CTE (coefficient of thermal expansion). Further, the matrix material embeds a magnetic substance, e.g., in form of magnetic particles. The magnetic substance or particles may be made of iron, nickel and/or molybdenum or mixtures and/or alloys of these materials. By way of example, iron, nickel or molybdenum powder particles may be contained in the encapsulation material. The particles may be coated with an insulating shell in order to avoid short circuits.

After its deposition, the encapsulation material may be hardened by a heat treatment. Various techniques may be employed to form the encapsulation body by the encapsulation material, for example, compression molding, transfer molding, injection molding, powder molding, liquid molding, dispensing or laminating.

After deposition, the encapsulation material may be cured to form the solid encapsulation body. The relative magnetic permeability (i.e., the ratio of the permeability of the encapsulation material to the permeability of the free space) of the winding core made of the encapsulation material may be high (between 60-150), medium (between 20-60) and low (between 3-20) depending on the application. The inductance of the inductor may be more than one or tens of $\mu H$.

According to one embodiment, the inductor is integrated in the semiconductor chip. To this end, a main surface of the semiconductor chip may be provided with a winding trench filled with metal.

According to one embodiment, the inductor may be externally attached to the semiconductor chip. To this end, wires representing coil windings may be placed (e.g., deposited or wire-bonded) on a main surface of the semiconductor chip.

In these and other embodiments, the winding core of the inductor is filled with the encapsulation material embedding magnetic particles. Thus, a part of the encapsulation body may form the winding core of the inductor.

The encapsulation material may be used to produce fan-out type packages. In a fan-out type package at least some of the external contact pads and/or conductor lines connecting the semiconductor chip to external contact pads of the package are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

One or more metal layers having the shape of conductor lines (or conductor tracks) may be placed over the semiconductor chip and the encapsulation body. The metal layers may, for example, be used to produce an electric redistribution structure. The conductor lines may be employed as wiring layers to make electrical contact with the semiconductor chip from outside the semiconductor package and/or to make electrical contact with other semiconductor chips and/or components contained in the semiconductor package. The conductor lines may couple contact pads of the semiconductor chip to the external contact pads. The conductor lines may be manufactured with any desired geometric shape and any desired material composition. Any desired metal, for example, aluminum, nickel, palladium, silver, tin, gold or copper, or metal alloys may be used as the material. The conductor lines need not be homogenous or manufactured from just one material, that is to say various compositions and concentrations of the materials contained in the conductor lines are possible. Furthermore, the conductor lines may be arranged above or below or between electrically insulating layers such as, e.g., dielectric polymer layers.

FIG. 1 schematically illustrates a semiconductor package 100 in cross section. The semiconductor package 100 includes a semiconductor chip 10 having a first main face 12 and a second main face 14 opposite to the first main face 12. The semiconductor package 100 further includes an inductor 16 having at least one winding 18. Furthermore, an encapsulation body 20 may cover the semiconductor chip 10. A part of the encapsulation body 20 fills a space within the winding(s) 18 to form a magnetic winding core. The encapsulation body 20 is made of a material containing one or more magnetic substances.

More specifically, as shown in FIG. 1, the at least one winding (in FIG. 1, by way of example, 4 windings are depicted) may be integrated in the semiconductor chip 10. To this end, one or more winding trenches 24 may be generated in the first main face 12 of the semiconductor chip 10 as will be described in more detail below. The winding trench 24 may have any desired geometry and dimensions depending, for instance, on the desired current load and/or magnetic field strength and/or application. By way of example, a width of a winding trench 24 may be about 2 $\mu m$, 5 $\mu m$, 10 $\mu m$ or more, and a depth of a winding trench 24 may, e.g., be about 10 $\mu m$, 30 $\mu m$, 50 $\mu m$ or more. An aspect ratio of, e.g., 10 or more may be obtained. The winding trench 24 and thus the windings 18 may have, e.g., a continuous, spiral extension. The plan view shape of a winding 18 may be circular, polygonal etc. The windings 18 form a coil which may be used as an inductance, e.g., in RF devices, as a frequency filter or in any other suitable applications. Further, multiple inductors 16 or coils may be formed in or connected to the semiconductor chip 10.

The winding trench 24 may be filled with any electrically conducting material, e.g., a metal or an electrically conductive polymer material. In one embodiment, by way of example, the winding trench 24 may be filled with copper or aluminum.

It is to be noted that the semiconductor chip 10 may be provided with chip contact pads which are not depicted in FIG. 1. Such chip contact pads are typically coupled to an integrated circuit (not illustrated) formed in the semiconductor chip 10 and/or to the windings 18 of the inductor 16. Without saying, an integrated circuit formed in the semiconductor chip 10 may be also be electrically coupled to the windings 18 of the inductor 16 by chip-internal wiring.

Figure 2D:
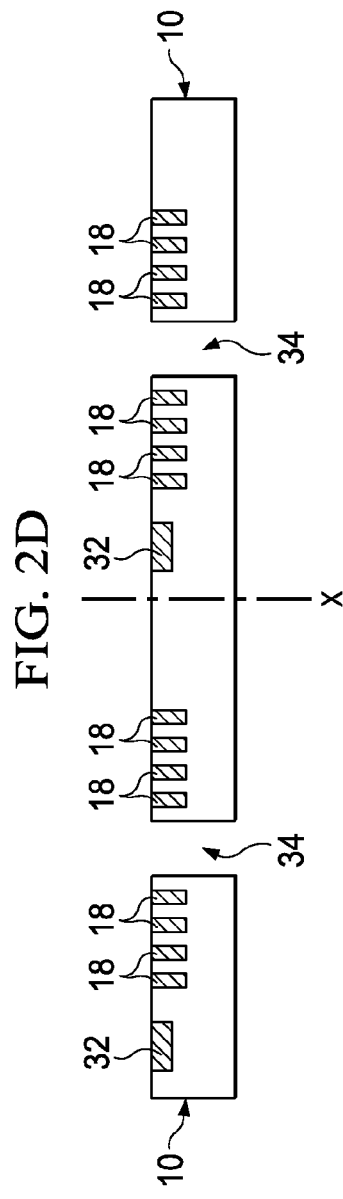
Figure 2E:
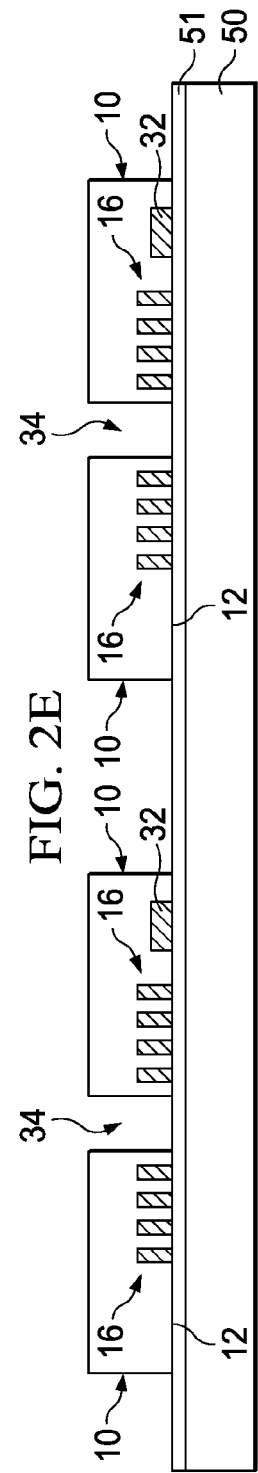
Figure 2I:
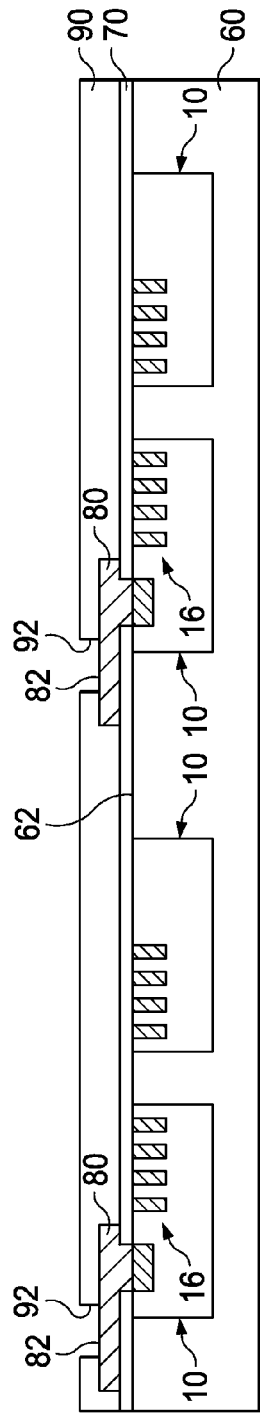
Figure 2J:
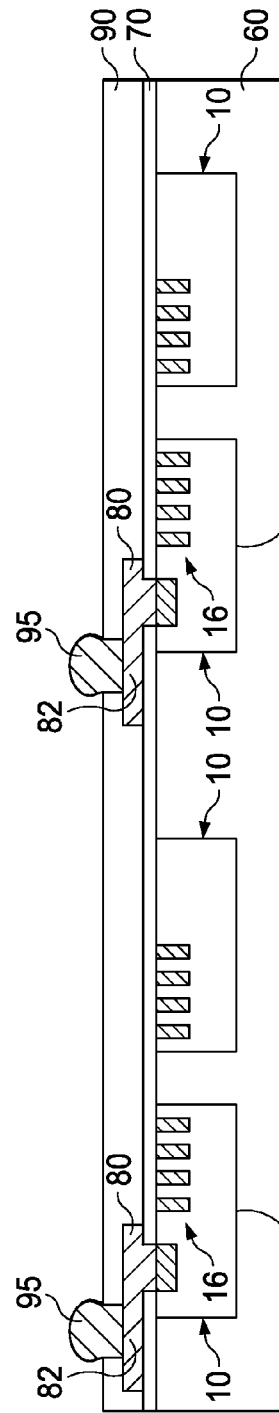
Figure 2K:
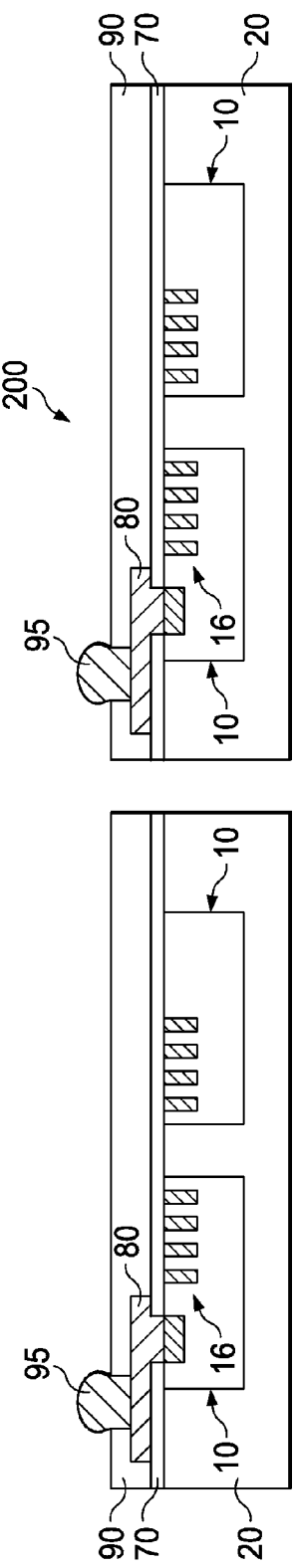

FIGS. 2A to 2K schematically illustrate a method of manufacturing a semiconductor package 200 as shown in FIG. 2K. The method illustrated in FIGS. 2A to 2K described below can be likewise applied to manufacture the package 100 of FIG. 1 and several other embodiments of packages described further below.

The semiconductor chips 10 as well as all other semiconductor chips described herein may be fabricated on a wafer 30 made of a semiconductor material. Such semiconductor wafer 30 is illustrated in FIG. 2A. The semiconductor wafer 30 may include a bulk silicon 31 in which integrated circuits (not shown) may be embedded. Chip contact pads 32 are located on a first main face 12 of the semiconductor wafer 30. The integrated circuits can be electrically accessed via the chip contact pads 32. The chip contact pads 32 may be made of a metal, for example, aluminum or copper, and may have any desired shape and size. Here, for the sake of illustrative ease, only one chip contact pad 32 for each functional chip region of the wafer 30 is depicted. Typically, depending on the integrated circuit, each functional chip region is provided with a plurality of chip contact pads 32. The integrated circuits and the chip pads 32 are formed on wafer level during so-called frontend wafer processing.

Winding trenches 24 and holes 34 may be formed in each functional chip region on wafer level. The production of the winding trenches 24 and holes 34 can be effected in many different ways which may, among others, depend on the material of the wafer 30. For example, RIE (reactive ion etching) may be used to produce the winding trenches 24 and holes 34.

Electrochemical etching constitutes one further possible production variant to form holes 34 or trenches 24. In order to prepare for the electrochemical etching, the first main face 12 of the wafer 30 is incipiently etched selectively with respect to a mask using, e.g., 10% strength potassium hydroxide solution for, e.g., 10 minutes. Afterwards, the first main face 12 is covered with an electrolyte, e.g., HF acid, and a voltage is applied between the second main face 14 and the electrolyte. The second main face 14 is simultaneously irradiated via a light source, e.g., with a wavelength of 800 nm. The intensity of the light source is set such that a predetermined current density, e.g., 10 nA per hole 34, flows between the wafer 30 and the electrolyte. As a result of the current between the incipiently etched first main face 12 of the wafer 30 and the electrolyte, pores form at the incipiently etched locations and grow into the wafer 30, thereby forming, e.g., the holes 34.

Instead of electrochemical etching described above, other hole or trench formation techniques may be employed for the production of the hole 34 or trench 24. In principle, all the formation methods known in micro-mechanics, such as, for example, RIE (reactive ion etching) methods, drilling, laser drilling, ultrasonic drilling or sandblasting can be used for this purpose.

By way of example, the wafer 30 may have a thickness within the range of 25 to 2000 µm, and optionally, within the range of 50 to 250 µm. The holes 34 may have a diameter within the range of 2 to 200 µm, and optionally within the range of 30 to 100 µm, e.g., about 50 µm. The ratio of hole length to hole diameter (aspect ratio) may lie within the range of 2 to 1000, and optionally relatively large aspect ratios above, e.g., 5, 10 or even 100 may be available. It is to be noted that the hole 34 may be a blind hole or a through hole. Typically, the hole 34 does at least extend in a space within the winding trench 24. The depth of the hole 34 may, e.g., be equal or greater than the depth of the winding trench 24.

An electrically conducting material is introduced into the winding trench 24 to form the windings 18 of the inductor 16 (FIG. 2C). In one embodiment, the electrically conducting material may be introduced by galvanic plating. To this end, a seed layer (not shown) may be deposited in the wiring trench 24 and a further layer is galvanically deposited ("plated") onto the seed layer. The further layer may be made of, e.g., copper and may have a thickness to completely fill the wiring trench 24.

As an alternative to the galvanic plating process referred to above, an electroless plating process such as electroless nickel-palladium plating may be used. Electroless plating is also referred to as chemical plating in the art. Further, other deposition methods such as physical vapor deposition (PVD), chemical vapor deposition (CVD), sputtering, or printing may be employed to fill the winding trench 24 with an electrically conducting material.

Further, printing technologies may be used to fill the winding trench 24 with an electrically conducting material. To this end, a paste containing fine metal particles may be used. The metal particles may, for example, be made of copper, silver, gold, tin or nickel or a metal alloy. The metal particles may be dispersed in a suitable liquid or solvent. The application of the paste containing the metal particles dispersed in the liquid may be performed, e.g., by stencil printing, screen printing, ink jet printing or other suitable printing technologies. After the application of the paste, the paste may be exposed to an energy (e.g., elevated temperature, etc). This temperature step causes the liquid in the paste to evaporate. Furthermore, the applied temperature may be lower than the melting temperature of the metal (when provided in macroscopic dimensions) of which the metal particles are made. Due to the temperature step, the metal particles may sinter and may thus form solid metal conductive windings 18.

As illustrated in FIG. 2D, the functional chip regions of the semiconductor wafer 30 may then be singulated into the semiconductor chips 10 by dicing the wafer 30 along the dash-dotted cutting line X (only two of the functional chip regions which, after dicing, correspond to semiconductor chips 10, are illustrated in FIG. 2D). Singulation may, for example, be accomplished by sawing, cutting, etching or laser ablation, e.g., stealth dicing. The semiconductor chips 10 illustrated in FIG. 2D may be an implementation of the semiconductor chip 10 shown in FIG. 1.

In order to package the semiconductor chips 10, a (temporary) carrier 50 is provided as illustrated in FIG. 2E. The carrier 50 may be a plate made of a rigid material, for example, a metal, metal alloy, silicon, glass or plastics. The carrier 50 may have at least one flat surface, and an adhesive tape 51, for example, a double sided sticky tape 51, may be laminated onto this surface of the carrier 50. Components of the semiconductor device to be fabricated can be placed on this adhesive tape 51. The shape of the carrier 50 is not limited to any geometric shape, for example, the carrier 50 may be round or square-shaped. The carrier 50 may have any appropriate size. Thus, the molded body (often referred to as "molded reconfigured wafer"), which is formed on the basis of the carrier 50, may, e.g., be disc-shaped having a diameter of, e.g., 200 or 300 mm, or may have any other shape such as a polygonal shape with the same or other lateral dimensions.

As illustrated in FIG. 2E, the semiconductor chips 10 are placed on the carrier 50. The semiconductor chips 10 can be fixed on the adhesive tape 51. Alternatively, a glue material or any other adhesive material or mechanical securing means (such as a clamping device or a vacuum generator) may be associated with the carrier 50 and used for fixing the semiconductor chips 10. The semiconductor chips 10 may be arranged in an array, wherein the spacing between neighboring semiconductor chips 10 may be determined according to the desired footprint area of the semiconductor package to be fabricated. The spacing between neighboring semiconductor chips 10 may, e.g., be in the range between 0.25 mm and 10 mm. It is to be noted that throughout FIGS. 2E to 2F, only a partial section of the carrier 50 and the molded body is illustrated, that is to say in practice, typically much more than two semiconductor chips 10 (e.g., some tens or more than hundred thereof) are placed on the carrier 50.

The semiconductor chips 10 are relocated on the carrier 50 in larger spacing as they have been in the wafer bond (FIG. 2E). The semiconductor chips 10 may have been manufactured on the same semiconductor wafer 30, but may alternatively have been manufactured on different semiconductor wafers. Furthermore, the semiconductor chips 10 may be physically identical, but may also contain different integrated circuits and/or represent other components. The semiconductor chips 10 may be arranged over the carrier 50 with their first main faces 12 containing the chip contact pads 32 facing the carrier 50. In this case, the first main faces 12 and the chip contact pads 32 may be in direct contact with the adhesive tape 51.

After the semiconductor chips 10 have been mounted on the carrier 50, they are encapsulated with an encapsulation material forming the molded body 60 as illustrated in FIG. 2F. The encapsulation material may partly or completely cover the second main faces 14 of the semiconductor chips 10 and also the side faces 9 of the semiconductor chips 10. The gaps between the semiconductor chips 10 may also be filled with the encapsulation material. Further, the holes 34 are at least partially filled with the encapsulation material such that encapsulation material is deposited in a space within the windings 18 to form a magnetic winding core.

For example, the encapsulation material may be a duroplastic or thermosetting mold material. The encapsulation material may be based on a polymer material such as, e.g., an epoxy material and may contain a filling material consisting of small particles of glass ($SiO_2$) or other electrically insulating mineral filler materials like $Al_2O_3$ or organic filler materials. The encapsulation material may further contain a magnetic substance. By way of example, the encapsulation material may contain a ferromagnetic material. The ferromagnetic material may be a magnetically soft ferromagnetic material. The encapsulation material may, for instance, contain particles of one or more of the group of iron, nickel or molybdenum. Such particles may be used to design powder cores of the inductors 16.

By way of example, depending on the requirements, in one embodiment the encapsulation material may contain about 79-81% nickel, 17% iron and 2-4% molybdenum. Such composition is known to provide MPP (molypermalloy powder) cores. In one other embodiment the encapsulation material may contain particles of a nickel-iron alloy (e.g. about 50% nickel and 50% iron). Such composition is known to provide High Flux powder cores. In still one other embodiment the encapsulation material may contain particles of a iron-silicon-aluminum alloy (e.g. about 85% iron, 9% silicon and 6% aluminum). Such composition is known to provide Sendust powder cores.

After curing, the encapsulation material provides stability to the array of semiconductor chips 10. Various techniques may be employed to cover the semiconductor chips 10 with the encapsulation material. The encapsulation material may, for example, be applied by compression molding, injection molding, granulate molding, powder molding or liquid molding.

By way of example, in a compression molding process, the liquid encapsulation material is dispensed into an open lower mold half of which the carrier 50 forms the bottom. Then, after dispensing the liquid encapsulation material, an upper mold half is moved down and spreads out the liquid encapsulation material until a cavity between the carrier 50 forming the bottom of the lower mold half and the upper mold half is completely filled. This process may be accompanied by the application of heat and pressure. After curing, the encapsulation material is rigid and forms the molded body 60. The larger the lateral size of the molded body 60 and the number of embedded semiconductor chips 10, the more cost efficient the process will typically be.

The semiconductor chips 10 encapsulated in the molded body 60 are released from the carrier 50, and the adhesive tape 51 is pealed from the molded body 60 as illustrated in FIG. 2G. The adhesive tape 51 may feature thermo-release properties, which allow the removal of the adhesive tape 51 during a heat-treatment.

After the release of the carrier 50 and the adhesive tape 51, the first main faces 12 of the semiconductor chips 10 and a lower or front side surface 62 of the molded body 60 form a substantially common plane 11. The plane 11 may include steps (not shown) which can have a height of, e.g., up to about 10 nm. In particular, a step may occur at the interface between the semiconductor chip 10 and the molded body 60. As described below and illustrated in FIGS. 2H-2J, an electric redistribution structure may be applied to the plane 11.

A dielectric layer 70 may be deposited on the plane 11 as illustrated in FIG. 2H. The dielectric layer 70 may be fabricated in various ways. For example, the dielectric layer 70 may be deposited from a gas phase or from a solution, or can be laminated onto the front side surface 62. Furthermore, thin-film technology methods or a standard PCB industry process flow can be used for the application of the dielectric layer 70. The dielectric layer 70 may be fabricated from a polymer, such as polyimide, silicone, epoxy, polyurethane, acrylonitrile butadiene styrene (ABS), polybenzoxazole, benzocyclobutene (BCB), polynorbornene, phenolic resins, cyclic olefinic (co)polymers, aromatic hydrocarbons, parylene, photoresist material, duroplast, silicon nitride or an inorganic, ceramic-like material, such as silicone-carbon compounds. The dielectric layer 70 may be fabricated from a polymer, such as parylene, photoresist material, imide, epoxy, duroplast, silicone, silicon nitride or an inorganic, ceramic-like material, such as silicone-carbon compounds. The thickness of the dielectric layer 70 may be up to 10 μm or even higher. The dielectric layer 70 may also be omitted.

In order to make electrical contacts to the integrated circuits embedded in the semiconductor chips 10, the dielectric layer 70 may be opened in areas where the contact pads 32 are arranged as illustrated in FIG. 2H. The openings 72 in the dielectric layer 70 may, for example, be produced by using photolithographic methods and/or etching methods.

A metal layer 80 is applied to the dielectric layer 70 and is structured as illustrated in FIG. 2I. According to one embodiment, a seed layer (not shown) possibly consisting of two different layers is applied. The first part of the seed layer is a barrier layer, which, for example, consists of titanium, titanium tungsten or palladium and is first deposited on the upper surface of the dielectric layer 70 and the exposed contact pads 32. The deposition of the barrier layer may be carried out by electroless deposition from a solution or by sputtering. The barrier layer may have a thickness in the range from 10 to 80 nm, in particular around 50 nm.

The thickness of the seed layer may be increased by depositing a further metal layer onto the barrier layer. The barrier layer can be used as an electrode for a galvanic deposition of the further metal layer. The top part of the seed layer may, for example, be made of copper and may have a thickness in the range from 100 to 200 nm.

A photoresist layer may be printed, electro-deposited or spin-coated on top of the seed layer (not illustrated). By exposure to light having a suitable wavelength through a mask and subsequent development or laser application, recesses are formed in the photoresist layer. Subsequently, the portion of the seed layer exposed by the recesses may be reinforced by galvanic deposition of a metallic material. During the galvanic deposition of the metallic material, the seed layer is employed as an electrode. Copper or other metals or metal alloys may be plated onto the seed layer in the unmasked areas and to the desired height, which is usually greater than 3 μm.

After the plating of the metal layer 80 the photoresist layer is stripped away by using an appropriate solvent. The now exposed portions of the original seed layer, which have not been covered with the metal layer 80, may be removed by a brief etching step thereby creating separated conductor lines as illustrated in FIG. 2I.

A dielectric layer 90 may be deposited on top of the metal layer 80 and may be opened in certain areas 92 to expose portions of the metal layer 80 as illustrated in FIG. 2J. The exposed portions of the metal layer 80 serve as external contact pads 82. The dielectric layer 90 may be produced by using the same or similar materials and processing steps as described above in connection with the dielectric layer 70. The dielectric layer 90 may have the function of a solder stop layer. The dielectric layer 90 may also be omitted, e.g., if the contact pads 82 are defined by the lateral dimensions of the structured metal layer 80 rather than by an overlying solder stop layer.

Solder deposits 95 may be placed onto the external contact pads 82 as illustrated in FIG. 2J. The solder deposits 95 may be applied to the external contact pads 82 by so-called "ball placement", in which pre-shaped balls composed of solder material are applied to the external contact pads 82. As an alternative to "ball placement", the solder deposits 95 may, for example, be applied by means of stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The solder deposits 95 may be used to electrically couple the semiconductor package 200 to other components, for example, a PCB. The solder deposits 95 are electrically coupled to the contact pads 32 of the semiconductor chips 10 via the structured metal layer 80.

As illustrated in FIG. 2K, the semiconductor packages 200 are separated from one another by separation of the molded body 60 and possibly the electric redistribution structure 70, 80, 90, for example, by sawing, cutting, etching or a laser beam.

The semiconductor packages 200 manufactured by the method described above may be fan-out type packages. The encapsulation body 20 allows the electric redistribution structure 70, 80, 90 to extend beyond the outline of the semiconductor chips 10. The external contact pads 82 therefore do not need to be arranged within the outline of the semiconductor chips 10, but can be distributed over a larger area. The increased area which is available for arrangement of the external contact pads 82 as a result of the encapsulation body 20 means that the external contact pads 82 cannot only be arranged at a great distance from one another, but that the maximum number of external contact pads 82 which can be arranged there is likewise increased compared to the situation when all the external contact pads 82 are arranged within the outline of the semiconductor chips 10. Such packages are also referred to as eWLB (enhanced Wafer Level BGA) package, where BGA abbreviates Ball Grid Array.

It is obvious to a person skilled in the art that the semiconductor packages 200 shown in FIG. 2K and the manufacturing thereof as described above are only intended to be an exemplary embodiment, and many variations are possible. Each of the semiconductor packages 200 described above contains a single semiconductor chip 10. Alternatively, two or more semiconductor chips 10 or passives of different types may be included in the same semiconductor package 200. Thus, system in package (SiP) structures comprising a number of chips in a single package are feasible. The semiconductor chips 10 and passives may differ in function, size, manufacturing technology etc.

Furthermore, the electric redistribution structure 70, 80, 90 may contain more than one metal layer 80. The metal layers may be stacked on top of each other, and dielectric layers may be arranged between adjacent metal layers.

Further, an electric redistribution structure (not shown) on the backside main surface 64 of the molded body 60 may be generated the same way as the electric redistribution structure 70, 80, 90 arranged on the front side surface 62. To this end, the backside surface 64 of the molded body 60 may be made planar by a thinning (e.g. CMP) operation. The electric redistribution structure on the backside main surface 64 of the molded body 60 may, e.g., provide a mounting platform for package-on-package (PoP) structures.

Figure 3:
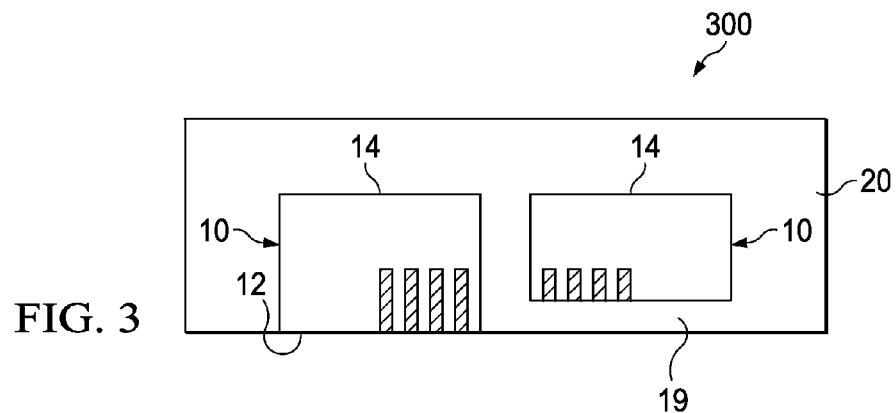
FIG. 3 is a cross-sectional view of an exemplary embodiment of a package comprising a semiconductor chip, an inductor and an encapsulation body.

FIG. 3 is cross-sectional view of an exemplary embodiment of a semiconductor package 300. The semiconductor package 300 is in many aspects similar to the semiconductor packages 100 and 200, and reference is made to the corresponding description in conjunction with FIGS. 1 to 2K in view of design similarities and method of manufacturing. As a difference to semiconductor package 100, the semiconductor package 300 uses a semiconductor chip 10 which is configured to have a recess 19 formed in the first main face 12 of the semiconductor chip 10. The recess 19 is arranged to connect to the hole 34 and extends from the hole 34 to the periphery or outline of the semiconductor chip 10.

The recess 19 may be of various design and shapes. By way of example, according to one embodiment, the recess 19 may be designed as a groove as shown in FIG. 4 (perspective view of semiconductor chip 10 according to FIG. 3) and FIG. 5 (bottom plan view of semiconductor package 300).

Figure 4:
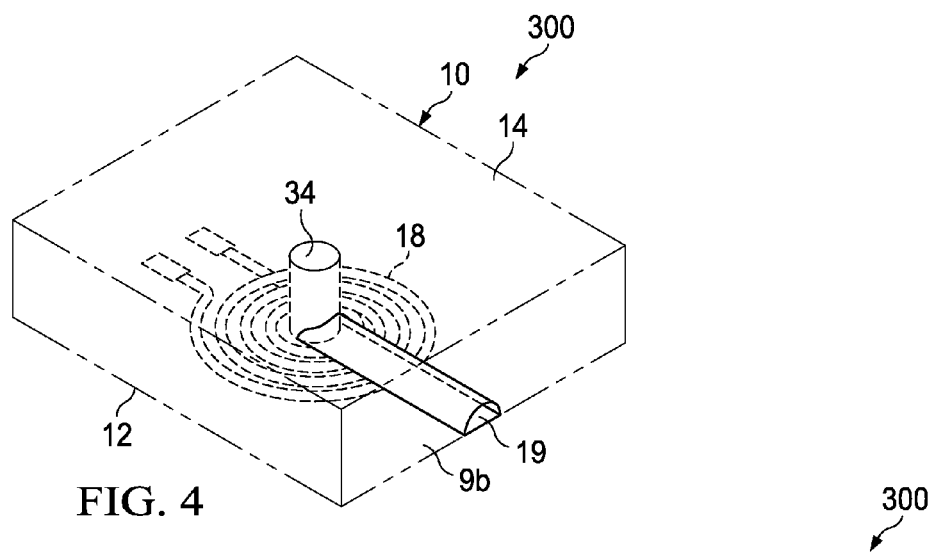
FIG. 4 is a perspective view of the embodiment of FIG. 3, wherein the encapsulation body is not shown.

According to FIG. 4, the groove 19 may have a rounded cross sectional shape and may, e.g., have about the same diameter as the hole 34. However, any other shapes are possible, e.g., the groove 19 may be a V-shaped groove or a groove having a rectangular cross-section. The recess 19 may be fabricated on wafer level by any suitable technique, e.g., sawing, etching, milling etc.

During the encapsulation process the encapsulation material fills the hole 34 and the groove 19. As a result, the windings 18 in the right hand part of FIG. 3 are encircled by a closed loop of encapsulation material. This closed loop of encapsulation material serves to guide and confine the lines of magnetic flux, resulting in an enhancement of the inductance of the magnetic coil (inductor) formed by the windings 18.

Figure 5:
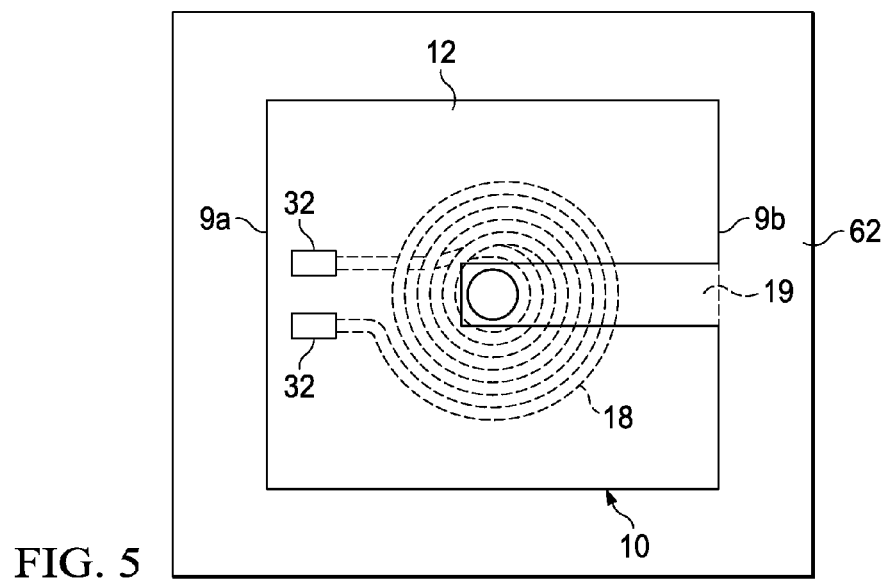
FIG. 5 is a bottom plan view of the embodiment of FIG. 3.

FIG. 5 is a bottom plan view of the package 300 according to one embodiment. The side faces at the left and right hand side of the semiconductor chip 10 are denoted by reference numeral 9a and 9b, respectively. As mentioned in the foregoing description, reference numeral 32 refers to contact pads arranged at the first main surface 12 of the semiconductor chip 10. The first main surface 12 of the semiconductor chip 10 may be flush with the bottom surface of the package 300, which is cut from the front side surface 62 of the molded body 60 (see FIG. 2G) and is therefore also denoted by reference numeral 62.

In the embodiment of a semiconductor package 300 as depicted in FIGS. 3 to 5, the contact pads 32 are connected to the ends of the windings 18. The windings 18 of the inductor 16 are illustrated by a dashed line. Further contact pads (not shown) may be distributed over the first main face 12 of the semiconductor chip 10 and may be connected to one or more integrated circuits embedded in the semiconductor chip 10. Further, it is to be noted that the semiconductor package 300 illustrated in FIGS. 3 to 5 is not equipped with an electric redistribution structure 70, 80, 90 similar as the package 100 illustrated in FIG. 1. However, without saying, an electric redistribution structure 70, 80, 90 and solder deposits 95 may be applied to the package 300 according to the description in conjunction with FIGS. 2H to 2K. In order to avoid reiteration, reference is made to these figures and the accompanying description in relation to the application of an electric redistribution structure to package 300.

Figure 6:
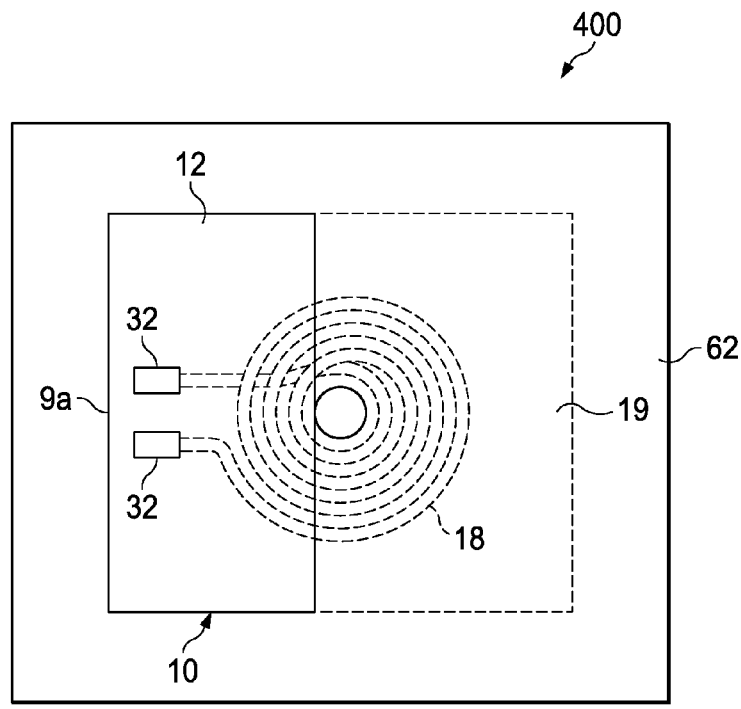
FIG. 6 is a bottom plan view of an embodiment similar to the embodiment shown in FIGS. 3 to 5.

FIG. 6 is a bottom plan view of a semiconductor package 400 which is similar to the semiconductor package 300 shown in FIGS. 3 to 5. More specifically, the cross-sectional view of FIG. 3 also applies to the package 400 shown in FIG. 6. However, different to the package 300 as illustrated in FIGS. 4 and 5, the recess 19 opens to more than one, namely, e.g., three side faces of the semiconductor chip 10 at the periphery thereof. In this embodiment, by way of example, the recess 19 does not open to side face 9a. In the recessed area of the semi-conductor chip 10, the outline of the semiconductor chip 10 is depicted by a dashed line.

In package 400 of FIG. 6, the closed loop of encapsulation material encircling the windings 18 extends over a larger spatial region than in package 300 shown in FIG. 5. Therefore, more lines of magnetic flux are guided entirely through the encapsulation material, resulting in that the inductance of the inductor 16 of FIG. 6 is greater than the inductance of the inductor 16 of FIG. 5.

Figure 7:
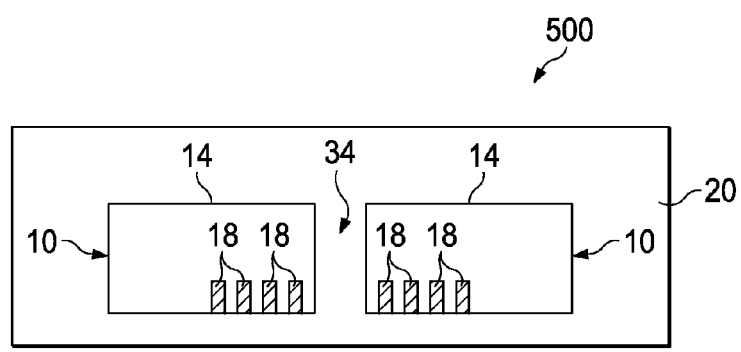
FIG. 7 is a cross-sectional view of an exemplary embodiment of a package comprising a semiconductor chip, an inductor and an encapsulation body.

FIG. 7 is a cross-sectional view of one embodiment of a semiconductor package 500. Here, the windings 18 are encircled by closed loops of encapsulation material both at the right hand side and the left hand side relative to the hole 34. At both sides, the recess 19 may be formed as a groove (see FIGS. 4 and 5) or as a continuously recessed area defined by three side faces of the semiconductor chip 10 as shown in FIG. 6. It is also possible that at one side the recess 19 is formed as one or more grooves and at the other side the recess 19 is formed as a fully recessed area defined by three side faces of the semiconductor chip 10 (see FIG. 6). The greater the angular range of the closed loop encapsulation material, the higher is the inductance of the inductor 16. To this end, an angular range of more than 10%, 20%, 50%, 70% or even 90% of the full range of 360° relative to the hole 34 may be implemented by encapsulation material forming a closed loop magnetic flux line path. Thus, by way of example, nearly the entire first main face 12 of the semiconductor chip 10 may be recessed except some remaining posts (not shown) on which the semiconductor chip 10 is placed during encapsulation. In view of other particulars of the semiconductor package 500, it is referred to the previous description of embodiments to avoid reiteration.

Figure 8:
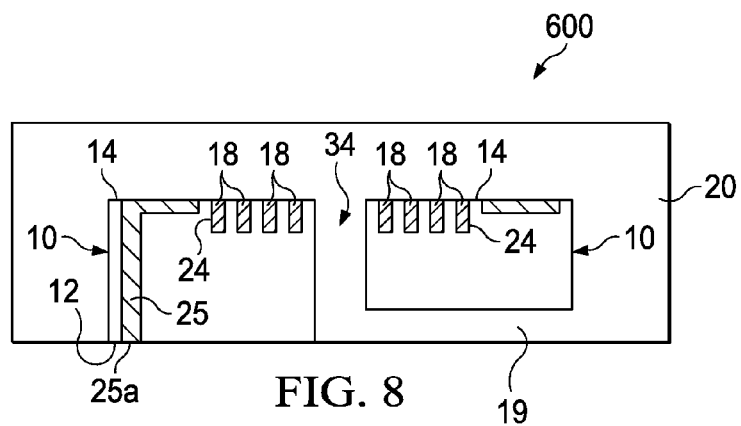
FIG. 8 is a cross-sectional view of an exemplary embodiment of a package comprising a semiconductor chip, an inductor and an encapsulation body.

FIG. 8 is a cross-sectional view of one embodiment of a semiconductor package 600. In package 600 the windings 18 of inductor 16 are located adjacent to the second main face 14 of the semiconductor chip 10. The generation of the windings 18 may be accomplished in accordance with the description in conjunction with FIGS. 2A to 2D, except that the second main face 14 rather than the first main face 12 of the wafer 30 is processed. In one embodiment the integrated circuit (not shown) of the semiconductor chip is formed at the first main face 12 (i.e., opposite to the windings 18). In another embodiment the integrated circuit (not shown) is formed in the second main face 14 of the semiconductor chip 10, i.e., in the same semiconductor surface in which the trenches 24 and windings 18 are implemented.

The semiconductor chip 10 of this and other embodiments may further comprise a via 25, which is filled with an electrically conductive material, e.g., metal. The via 25 may run from the first main face 12 to the second main face 14 of the semiconductor chip 10. Thus, the via 25 may form an electric feed-through to route electrical signals from the second main face 14 to the first main face 12 of the semiconductor chip, which may be exposed at the bottom of the package 600. An exposed area 25a of via 25 may be used as a chip contact pad similar to chip contact pads 32. More specifically, exposed areas 25a of vias 25 may be connected to an electric redistribution structure 70, 80, 90 as illustrated in FIGS. 2A to 2K. The vias 25 may be produced by the same techniques as the hole 34 or any other technique known in the art to generate TSV (Through Silicon Vias).

Still referring to package 600, again, as explained in conjunction with FIGS. 3 to 7, the first main face 12 of the semiconductor chip 10 may comprise a recess 19 in order to provide for closed magnetic flux line path running entirely through encapsulation material. The recess 19 may be formed in accordance with the illustrations in FIGS. 4 to 7. Concerning FIG. 7, vias 25 are provided in regions of the first main face 12 of the semiconductor chip 10 which are not recessed (e.g. posts).

Figure 9:
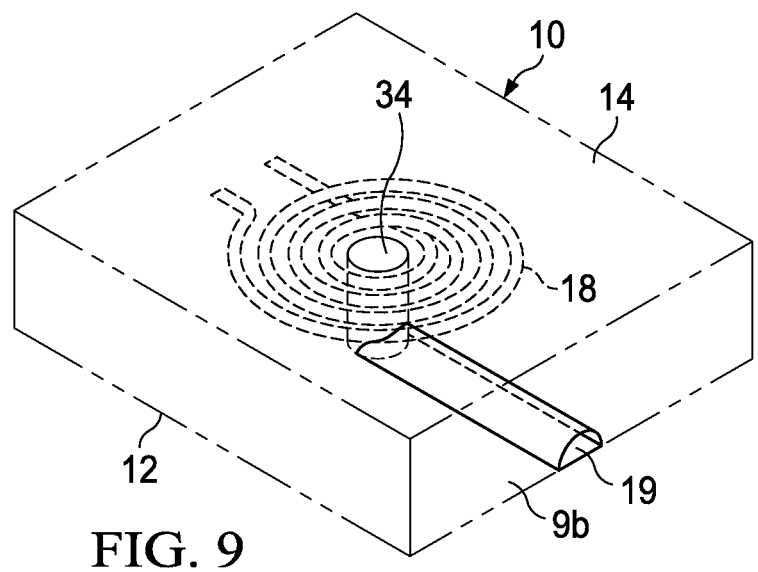
FIG. 9 is a perspective view of the embodiment of FIG. 8, wherein the encapsulation body is not shown.

By way of example, FIG. 9 provides a perspective view of a possible implementation of the semiconductor chip 10 used in package 600 as shown in FIG. 8. Here, similar to the embodiment shown in FIGS. 4 and 5, the recess 19 has the shape of a groove or channel opening to one side face 9b of the semiconductor chip 10. Without saying, similar to other embodiments, a plurality of such grooves 19 may be implemented in order to increase the inductance and/or in order to facilitate the filling of the hole 34 and the groove 19 (i.e., the recess) with encapsulation material during molding.

Figure 10:
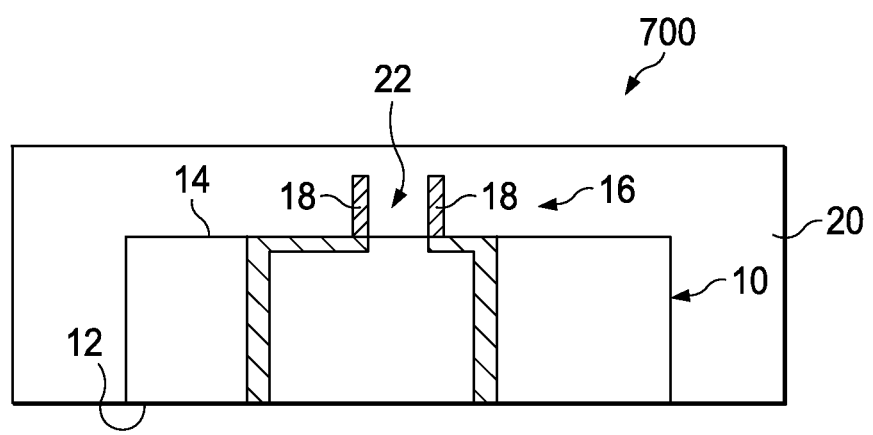
FIG. 10 is a cross-sectional view of an exemplary embodiment of a package comprising a semiconductor chip, an inductor and an encapsulation body.

FIG. 10 is a cross-sectional view of an embodiment of a semiconductor package 700. In many aspects package 700 may be produced and devised similar to packages 100 to 600, and it is referred to the foregoing description in order to avoid reiteration. However, as a difference to packages 100 to 600, the one or more windings 18 are mounted onto the semiconductor chip 10 rather than being integrated in the semiconductor chip 10. More specifically, the winding 18 may be arranged onto the second main surface 14 of the semiconductor chip 10 by any appropriate mounting or deposition process such as galvanically or electroless plating, printing etc. These processes have been described before and reference is made to the corresponding description. Further, not illustrated in FIG. 10, the windings 18 may be implemented by a bond wire coil bonded onto contact pads at the second main surface 14 of the semiconductor chip 10. Similar to the deposited windings 18 shown in FIG. 10, an inner free space 22 of the bond wire coil may be filled with the encapsulation material during the encapsulation (e.g. molding) process.

Further, in one embodiment as shown in FIG. 10, the semiconductor chip 10 may optionally be provided without hole 34 in the main face on which the winding 18 is placed (e.g. the second main face 14). Nevertheless, a free space 22 between the winding 18 may be filled with encapsulation material which forms a winding core of the inductor 16 during encapsulation.

Referring to FIG. 10, in another embodiment (not shown) the semiconductor chip 10 is equipped with a hole 34 running through the semiconductor chip 10 as explained before. Further, the first main face 12 of the semiconductor chip 10 may be provided with a recess 19 as explained before. In this case, the encapsulation material may provide for a closed magnetic flux line path in accordance with the description of embodiments shown in FIGS. 3 to 9.

Similar to package 600, vias 25 may be provided to route electrical signals from the windings 18 on top of the second main face 14 of the semiconductor chip 10 to the first main face 12 of the semiconductor chip 10. Further, vias 25 (not shown) may be provided to connect to an integrated circuit (not shown) established, e.g., at the second main face 14 of the semi-conductor chip 10. Or, as already described in conjunction with FIG. 8, an integrated circuit (not shown) may be embedded adjacent to the first main face 12 of the semiconductor chip 10, i.e., opposite to the second main face 14 where the winding(s) 18 is (are) arranged.

In all embodiments, the (optional) recess 19 may have a depth within the range of 2 to 200 μm, and optionally within the range of 30 to 100 μm, e.g., about 50 μm. Further, in all embodiments, the polymer or encapsulation material filling the space within the winding(s) 18 is provided with a magnetic substance to provide for a magnetic winding core of a relative permeability greater than 1 ($\mu r > 1$).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a semiconductor chip having a first main surface;
   an inductor disposed in the semiconductor chip, the inductor having a winding;
   an encapsulation body comprising an encapsulation material, wherein the encapsulation material contains a magnetic component and fills a space within the winding to form a magnetic winding core; and
   an electric redistribution structure extending over a surface of the encapsulation body and over the first main surface of the semiconductor chip.

2. The semiconductor package of claim 1, wherein the semiconductor chip comprises a hole, the hole comprising the space within the winding that is filled with the encapsulation material.

3. The semiconductor package of claim 2, wherein the semiconductor chip comprises a recess provided in a first main surface of the semiconductor chip, the recess laterally extending from the hole to an outline of the semiconductor chip and being filled with encapsulation material.

4. The semiconductor package of claim 3, wherein the semiconductor chip comprises a winding trench provided in the first main surface, the winding trench being filled with a metal material to form the winding.

5. The semiconductor package of claim 3, wherein the semiconductor chip comprises a winding trench provided in a second main surface of the semiconductor chip opposite to the first main surface, the winding trench being filled with a metal material to form the winding.

6. The semiconductor package of claim 3, wherein the semiconductor chip comprises a second main surface opposite to the first main surface and side faces extending from the first main surface to the second main surface, and wherein the encapsulation body entirely covers the side faces of the semiconductor chip.

7. The semiconductor package of claim 6, wherein the encapsulation body comprises a surface which is substantially coplanar with the first main surface of the semiconductor chip.

8. The semiconductor package of claim 7, wherein the electric redistribution structure has at least one structured metal layer and one polymer layer.

9. The semiconductor package of claim 1, wherein the semiconductor chip comprises a winding trench provided in a main semiconductor chip surface, the winding trench being filled with a metal material to form the winding.

10. The semiconductor package of claim 1, wherein the encapsulation material comprises a polymer material embedding magnetic particles.

11. The semiconductor package of claim 10, wherein the magnetic particles comprise iron, nickel and/or molybdenum.

12. A method of manufacturing a semiconductor package, the method comprising:
    attaching a semiconductor chip to a carrier, the semiconductor chip including an inductor having a winding;
    depositing an encapsulation material onto the semiconductor chip to form an encapsulation body, the encapsulation material containing a magnetic component and filling a space within the winding to form a magnetic winding core; and
    applying an electric redistribution structure to the encapsulation body.

13. The method of claim 12, wherein attaching a semiconductor chip comprises attaching a plurality of semiconductor chips, each semiconductor chip including an inductor, the method further comprising singulating the encapsulation body in at least two semiconductor packages.

14. The method of claim 13, further comprising:
    providing a semiconductor wafer comprising multiple functional chip regions;
    applying the inductor having the winding to each functional chip region of the semiconductor wafer; and
    separating the wafer into semiconductor chips, each of the semiconductor chip comprising the functional chip region equipped with inductors.

15. The method of claim 14, further comprising generating a hole into each functional chip region, the hole comprising the space within the winding to be filled with the encapsulation material to form the magnetic winding core.

16. The method of claim 15, further comprising generating a recess into a wafer surface of each functional chip region, the recess laterally extending from the hole to an outline of the functional chip region.

17. The method of claim 14, further comprising:
    generating a winding trench into a wafer surface of each functional chip region; and
    depositing metal material into the winding trench to form the winding of the inductor.

18. The method of claim 12, wherein the encapsulation body is formed by compression molding, transfer molding, injection molding, powder molding, liquid molding, dispensing or laminating.

19. The method of claim 12, wherein the encapsulation material is based on a polymer matrix material embedding magnetic particles.

20. The method of claim 19, wherein the magnetic particles comprise iron, nickel and/or molybdenum.

21. A semiconductor package, comprising:
    a semiconductor chip having a first main surface;
    an encapsulation body disposed around the semiconductor chip;
    an inductor integrated in the semiconductor chip, the inductor having a winding; and
    an electric redistribution structure extending over a surface of the encapsulation body and over the first main surface of the semiconductor chip, wherein the semiconductor chip comprises a hole running through the winding, the hole filled with a polymer material embedding magnetic particles.

22. The semiconductor package of claim 21, wherein the encapsulation body comprises an encapsulation material, wherein the encapsulation material is made of the polymer material embedding magnetic particles.

23. The semiconductor package of claim 21, wherein the semiconductor chip further comprises an integrated circuit electrically coupled to the winding.

* * * * *